United States Patent
Noh

(10) Patent No.: US 8,599,628 B2
(45) Date of Patent: Dec. 3, 2013

(54) PRECHARGE SIGNAL GENERATION CIRCUIT, SEMICONDUCTOR DEVICE INCLUDING THE SAME, AND METHOD FOR GENERATING PRECHARGE SIGNAL

(75) Inventor: Young-Kyu Noh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 29 days.

(21) Appl. No.: 13/333,370

(22) Filed: Dec. 21, 2011

(65) Prior Publication Data

US 2013/0100751 A1    Apr. 25, 2013

(30) Foreign Application Priority Data

Oct. 21, 2011   (KR) .................. 10-2011-0108006

(51) Int. Cl.
*G11C 7/00*   (2006.01)

(52) U.S. Cl.
USPC ............................................ 365/194; 365/203

(58) Field of Classification Search
USPC .................................... 365/194, 203
See application file for complete search history.

(56) References Cited

U.S. PATENT DOCUMENTS

2010/0296358 A1* 11/2010 Lee ........................ 365/230.06
2011/0149661 A1*  6/2011 Rajwani et al. ......... 365/189.11

* cited by examiner

*Primary Examiner* — Michael Tran
(74) *Attorney, Agent, or Firm* — IP & T Group LLP

(57) ABSTRACT

A precharge signal generation circuit includes a control signal generation unit configured to activate a control signal in response to a read command or write command and a precharge signal generation unit configured to use a clock signal in a period when the control signal is activated to activate a precharge signal at a time point when a delay time passes from an input of the read command or the write command to precharge signal generation circuit.

9 Claims, 2 Drawing Sheets

PRECHARGE SIGNAL GENERATION CIRCUIT, SEMICONDUCTOR DEVICE INCLUDING THE SAME, AND METHOD FOR GENERATING PRECHARGE SIGNAL

CROSS-REFERENCE TO RELATED APPLICATIONS

The present application claims priority of Korean Patent Application No. 10-2011-0108006, filed on Oct. 21, 2011, which is incorporated herein by reference in its entirety.

BACKGROUND

1. Field

Exemplary embodiments of the present invention relate to a precharge generation circuit and a semiconductor device including the same, and more particularly, to a method for generating a precharge signal.

2. Description of the Related Art

A memory device typically receives a command from the outside and performs active and precharge operations. The memory device performs a read operation or a write operation during the active operation. During the read operation, the memory device outputs data from a memory cell, and during the write operation, the memory device inputs data to a memory cell. Even after the read or write operation is completed, signals corresponding to the inputted or outputted data may remain in a bit line and data input/output lines through which the data input/output operation was performed. The respective signal lines are to be precharged to a preset level, in order to smoothly perform the next read operation or write operation. Therefore, the memory device performs a precharge operation to precharge the respective signal lines between the active operation periods.

The precharge operation may include manual precharge and auto precharge operations. The manual precharge operation is performed in response to an input of a command from an external device of the memory device, and the auto precharge accompanies a write or read operation. An auto precharge operation with a write operation is performed at a time point when a write recovery time (hereafter, referred to as tWR) passes from an input of a write command. Furthermore, an auto precharge operation with a read operation is performed at a time point when a read to precharge time (hereafter, referred to as tRTP) passes from an input of a read command. The values of the tWR and tRTP may be stored in a mode resister set (MRS) based on the specifications of Joint Electron Device Engineering Council (JEDEC).

Here, the auto precharge operation is performed in response to a precharge signal which is activated by a precharge signal generation circuit at a time point when the tWR passes from an input of a write command or the tRTP passes from an input of a read command.

FIG. 1 is a waveform diagram explaining the operation of a conventional precharge signal generation circuit.

Hereafter, referring to FIG. 1, the operation of the conventional precharge signal generation circuit during the auto precharge operation with the write operation will be described.

The precharge signal generation circuit receives a clock signal CLK transferred from a source clock signal SCLK, from a time point 101 when an active command ACT is applied. Then, the precharge signal generation circuit activates a precharge signal PCG at a time point 103 when a tWR passes from an application of a write command WT. When a read command RD is applied, the precharge signal generation circuit activates the precharge signal PCG at a time point when a tRTP passes from an application of the read command RD. The tWR and tRTP are defined based on the period of the clock signal CLK. For example, the tWR may be a time corresponding to six clocks, and the tRTP may be a time corresponding to four clocks. Here, the precharge signal generation circuit receives the clock signal CLK from the time point when the active command ACT is applied.

In the precharge signal generation circuit, however, the clock signal CLK is actually used is not the time point 101 where the active command ACT is applied, but a time point 102 where the write command WT or the read command RD is applied after the active command ACT is applied. That is because the time point when the precharge signal PCG is activated is defined on the basis of the clock signal CLK, from not the time point 101 when the active command ACT is applied, but the time point 102 when the write command WT or the read command RD is applied. Therefore, during a period from the time point 101 when the active command ACT is applied to the time point 102 when the write command WT or the read command RD is applied, the clock signal CLK may be supplied to the precharge signal generation circuit and, therefore, may cause the undesirable current consumption of the precharge signal generation circuit.

SUMMARY

Exemplary embodiments of the present invention are directed to a precharge signal generation circuit and a semiconductor device, which are capable of effectively reducing current consumption with controlling the supply of a clock signal.

In accordance with an exemplary embodiment of the present invention, a precharge signal generation circuit includes a control signal generation unit configured to activate a control signal in response to a read command or write command, and a precharge signal generation unit configured to use a clock signal in a period when the control signal is activated to activate a precharge signal at a time point when a delay time passes from an input of the read command or the write command to precharge signal generation circuit.

In accordance with another exemplary embodiment of the present invention, a method for generating a precharge signal includes receiving a read command or write command, activating a control signal in response to the read command or the write command; and receiving a clock signal in a period when the control signal is activated, and activating a precharge signal at a time point when a delay time passes from the input of the read command or the write command.

In accordance with yet another exemplary embodiment of the present invention, a semiconductor device includes a command decoder configured to decode an external command and generate a read command or write command, a clock transfer unit configured to transfer an external clock signal as a source clock signal, a precharge signal generation unit configured to generate a precharge signal in response to the read command or the write command, and use the source clock signal during a period from a time point when the read command or the write command is inputted to a time point when the precharge signal is activated; and a precharge operation control unit configured to control a precharge operation of the semiconductor device in response to the precharge signal.

DETAILED DESCRIPTION

Figure 1:
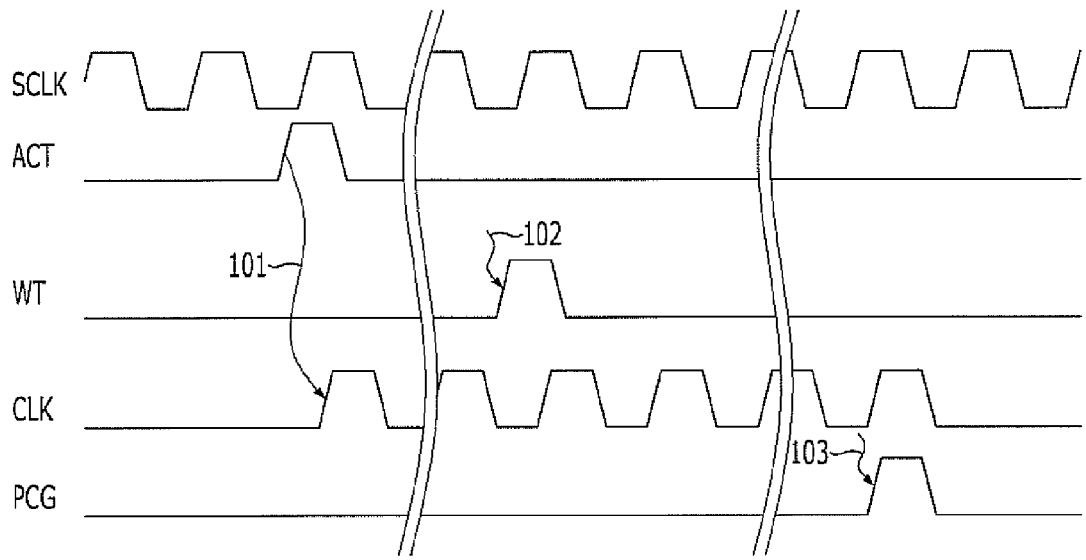
FIG. 1 is a waveform diagram explaining the operation of a conventional precharge signal generation circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the present specification, a read command RD and a write command WT may include the read command RD with precharge and the write command WT with precharge, which were described in the related art.

Figure 2:
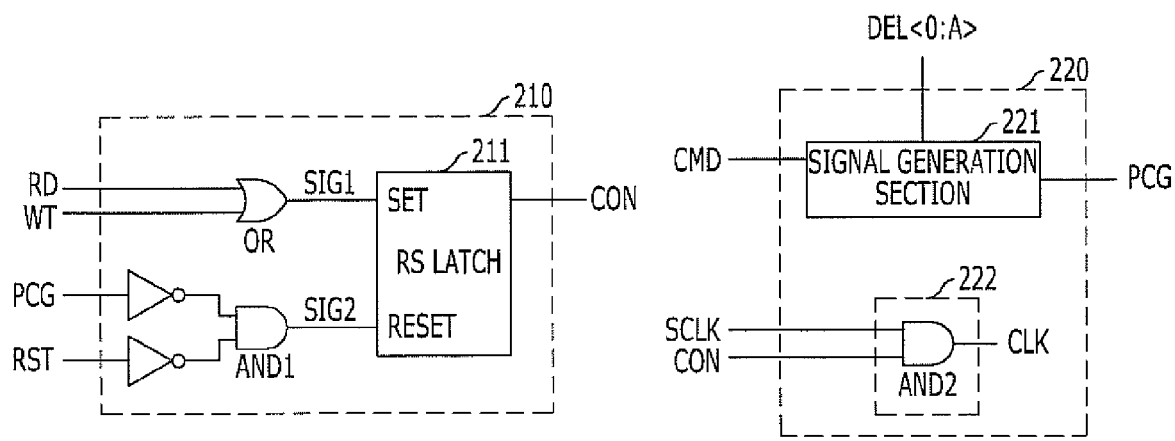
FIG. 2 is a diagram of showing a precharge signal generation circuit in accordance with an exemplary embodiment of the present invention.

FIG. 2 is a configuration diagram of a precharge signal generation circuit in accordance with an exemplary embodiment of the present invention.

Referring to FIG. 2, the precharge signal generation circuit includes a control signal generation unit 210 and a precharge signal generation unit 220. The control signal generation unit 210 is configured to activate a control signal CON in response to a read signal RD or a write command WT, and the precharge signal generation unit 220 is configured to receive a clock signal CLK in a period when the control signal CON is activated and activate a precharge signal PCG at a time point when a delay time passes from the input of the read command RD or write command WT.

The control signal generation unit 210 activates the control signal CON when the read command RD or the write command WT is applied after an active command ACT is applied and activated. The control signal CON is a signal for determining a period that the clock signal CLK is supplied to the precharge signal generation unit 220, that is, an activation period of the precharge signal generation unit 220. Then, the control signal generation unit 210 deactivates the control signal CON when the precharge signal PCG is activated. This is because the clock signal CLK is not used in the precharge signal generation unit 220, after the precharge signal PCG is generated. A reset signal RST is a signal for resetting the control signal CON to a deactivation state.

For this operation, the control signal generation unit 210 may include an RS latch 211 configured to receive a first signal SIG1 as a set input SET and receive a second signal SIG2 as a reset input RESET. The first signal SIG1 is obtained by combining the read command RD and the write command WT through an OR gate OR1, and the second signal SIG2 is obtained by combining the precharge signal PCG and the reset signal RST through an OR gate OR2.

The precharge signal generation unit 220 receives the clock signal CLK in a period when the control signal CON is activated and activates the precharge signal PCG at a time point when a delay time passes from the input of the read command RD or the write command WT. Here, the delay time is tRTP when the read command RD is applied and tWR when the write command WT is applied. The tRTP and tWR are explained above in the description of the related art. When the precharge signal PCG is activated, an activated bit line is precharged by a circuit (not illustrated) for controlling the precharge of a bit line. Here, the precharge signal PCG may include a precharge command generated inside a memory device.

For this operation, the precharge signal generation unit 220 may include a signal generation section 221 and a clock supply section 222. The signal generation section 221 is configured to receive the clock signal CLK and activate the precharge signal PCG at a time point when a delay time passes from the input of the read command or the write command WT. The clock supply section 222 is configured to supply the clock signal CLK received from the source clock signal SCLK to the signal generation section 221 during the period when the control signal CON is activated.

The signal generation section 221 activates the precharge signal PCG in synchronization with the clock signal CLK at a time point when the delay time passes from the input of the read command RD or the write command WT, during the period when the control signal CON is activated. The delay time may be determined on the basis of the clock signal CLK in response to delay information DEL<0:A>. The signal generation section 221 may generate the precharge signal PCG by shifting the command signal CMD by the delay time in synchronization with the clock signal CLK. Here, the command signal CMD may include the applied read command RD or write command WT or a signal which is activated when the read command RD or write command WT is applied. In the latter case, the command signal CMD may include a pulse signal having the same pulse width as the read command RD or write command WT.

For the above-described operation, the signal generation section 221 may include a shifting circuit (not illustrated) configured to perform an operation of shifting the command signal CMD in synchronization with the clock signal CLK. Here, the shifting circuit may include a D flip-flop circuit. The delay information DEL<0:A> indicates how many clocks the tRTP or tWR has. As described with reference to FIG. 1, the delay information DEL<0:A> may be set and stored in an MRS.

The clock supply section 222 supplies the clock signal CLK transferred from the source clock signal SCLK to the signal generation section 221 only during the period when the control signal CON is activated and does not transfer the source clock signal SCLK as the clock signal CLK when the control signal CON is deactivated, such that the clock signal CLK is not supplied to the signal generation section 221. For this operation, the clock supply section 222 may include an AND gate AND configured to combine the control signal CON and the source clock signal SCLK and output the combined signal as the clock signal CLK.

The precharge signal generation circuit in accordance with the embodiment of the present invention receives the clock signal CLK after the read command RD or the write command WT is applied, different from the conventional precharge signal generation circuit. Therefore, during a period from the time point when the active command ACT is applied to the time point when the read command RD or the write command WT is applied, the precharge signal generation circuit does not receive the clock signal CLK. Therefore, undesirable current consumption may be reduced, and thus power consumption may be reduced in an effective manner.

Referring to FIG. 2, a method for generating a precharge signal in accordance with the embodiment of the present invention will be described.

The method for generating a precharge signal in accordance with the embodiment of the present invention includes receiving a read command RD or write command WT, activating a control signal CON in response to the read command RD or the write command WT, and receiving a clock signal CLK in a period when the control signal CON is activated and activating a precharge signal PCG at a time point when a delay time passes from the input of the read command RD or the write command WT.

The method for generating a precharge signal may further include receiving an active command ACT, before the receiving of the read command RD or the write command WT, and deactivating the control signal CON, when the precharge signal PCG is activated. Since the clock signal CLK is not used after the precharge signal PCG is activated, the control signal CON is deactivated.

When the control signal CON is deactivated, the clock signal CLK is not supplied, and the delay time is determined on the basis of the clock signal CLK in response to the delay information DEL<0:A>.

Figure 3:
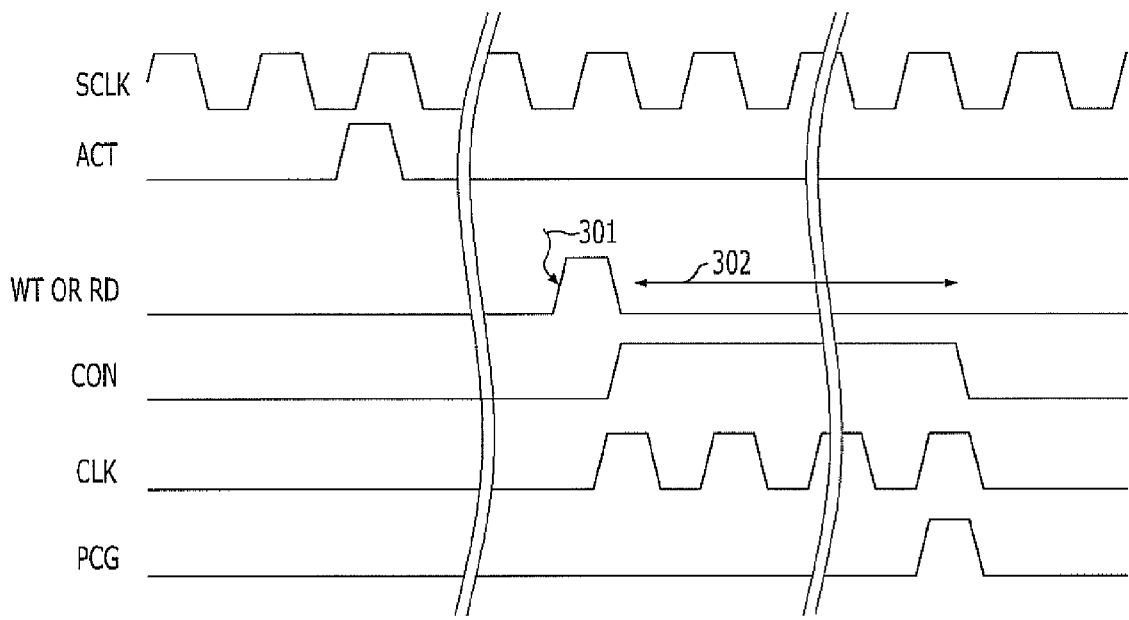
FIG. 3 is a waveform diagram explaining the operation of the precharge signal generation circuit of FIG. 2.

FIG. 3 is a waveform diagram explaining the operation of the precharge signal generation circuit of FIG. 2.

Referring to FIG. 3, the operation of the precharge signal generation circuit of FIG. 2 will be described.

The precharge signal generation circuit of FIG. 2 activates the precharge signal PCG at a time point when a delay time 302 passes from a time point 301 when the write command WT or the read command RD is applied after the active command ACT is applied. Here, the delay time 302 is tWR when the write command WT is applied and tRTP when the read command RD is applied. For this operation, when the write command WT or the read command RD is applied, the control signal CON is activated by the control signal generation unit 210. When the control signal CON is activated, the clock signal CLK transferred from the source clock signal SCLK is supplied to the signal generation section 221 by the clock supply section 222. Then, when the precharge signal PCG is activated, the control signal generation unit 210 deactivates the control signal CON. When the control signal CON is deactivated, the clock supply section 221 does not transfer the source clock signal SCLK as the clock signal CLK. Therefore, the clock signal CLK is not supplied to the signal generation section 222.

Accordingly, the precharge signal generation circuit in accordance with the embodiment of the present invention receives the clock signal CLK only when it is used, different from the conventional precharge signal generation circuit. Therefore, the precharge signal generation circuit may reduce current consumption, thereby reducing the power consumption.

Figure 4:
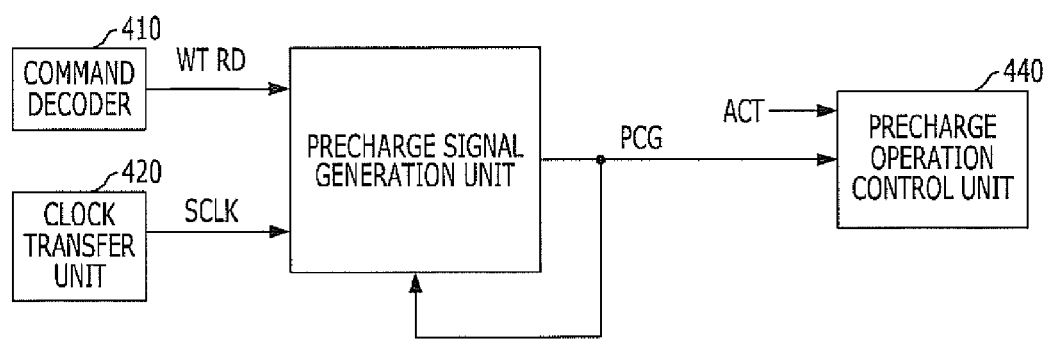
FIG. 4 is a diagram of a semiconductor device in accordance with another exemplary embodiment of the present invention.

FIG. 4 is a configuration diagram of a semiconductor device in accordance with another embodiment of the present invention.

Referring to FIG. 4, the semiconductor device includes a command decoder 410, a clock transfer unit 420, a precharge signal generation unit 430, and a precharge operation control unit 440. The command decoder 410 is configured to decode an external command and generate a read command RD or write command WT. The clock transfer unit 420 is configured to transfer an external clock signal as a source clock signal SCLK. The precharge signal generation unit 430 is configured to generate a precharge signal PCG in response to the read command RD or write command WT and use the source clock signal SCLK only during a period from a time point when the read command RD or the write command WT is applied to a time point when the precharge signal PCG is activated. The precharge operation control unit 440 is configured to control a precharge operation of a bit line in response to the precharge signal PCG.

The command decoder 410 decodes an external command (not illustrated) applied from the outside of the semiconductor device, and generates the read command RD and the write command WT which are internal commands of the semiconductor device.

The clock transfer unit 420 transfers a clock signal (not illustrated) received from the outside of the semiconductor device or a clock signal (not illustrated) received from the inside of the semiconductor device as the source clock signal SCLK. The clock transfer unit 420 may include a clock input buffer circuit.

The configuration and operation of the precharge signal generation unit of FIG. 4 are the same as those of the precharge signal generation circuit of FIG. 2. Therefore, the precharge signal generation unit 430 activates the precharge signal PCG at a time point when a delay time passes from a time point when the read command RD or the write command WT is applied. Here, the precharge signal generation unit 430 receives the source clock signal SCLK regardless of the application of the read command RD or the write command WT and the precharge signal PCG, but uses the clock signal only during a period from a time point when the read command RD or the write command WT is applied to a time point when the precharge signal PCG is activated (refer to the above descriptions with reference to FIG. 2).

The delay time may be determined on the basis of the clock signal in response to the delay information DEL<0:A>. Here, the delay information DEL<0:A> may be stored in an MRS (not illustrated in FIG. 4). The delay time is tWR when the write command WT is applied and tRTP when the read command RD is applied.

The precharge operation control unit 440 may include components which perform the precharge operation of a bit line in response to the precharge signal PCG. For example, the precharge operation control unit 440 may include a control circuit configured to control a bit line sense amplifier.

The semiconductor device in accordance with the embodiment of the present invention uses the clock signal only during the period from the time point when the read command RD or the write command WT is applied to the time point when the precharge signal PCG is activated. Therefore, current consumption may be reduced, and thus power consumption may be reduced.

While the present invention has been described with respect to the specific embodiments, it will be apparent to those skilled in the art that various changes and modifications may be made without departing from the spirit and scope of the invention as defined in the following claims.

What is claimed is:

1. A precharge signal generation circuit comprising:
   a control signal generation unit configured to activate a control signal in response to a read command or write command; and
   a precharge signal generation unit configured to use a clock signal in a period when the control signal is activated to activate a precharge signal at a time point when a delay time passes from an input of the read command or the write command to the precharge signal generation circuit,
   wherein the precharge signal generation unit comprises:
   a signal generation section configured to shift the read command or the write command by the delay time in synchronization with the clock signal; and a clock supply section configured to supply the clock signal to the signal generation section in the period when the control signal is activated, and wherein the control signal generation unit is configured to deactivate the control signal when the precharge signal is activated.

2. The precharge signal generation circuit of claim 1, wherein the delay time is determined on the basis of the clock signal in response to delay information.

3. The precharge signal generation circuit of claim 1, wherein the clock supply section is configured to stop supplying the clock signal to the signal generation section, when the precharge signal is activated.

4. The precharge signal generation circuit of claim 1, wherein the read command or the write command is applied after an active command is applied.

5. A method for generating a precharge signal, comprising:
receiving a read command or write command;
activating a control signal in response to the read command or the write command; and
receiving a clock signal in a period when the control signal is activated, and activating a precharge signal at a time point when a delay time passes from the receiving of the read command or the write command,
wherein the delay time is determined on the basis of the clock signal in response to delay information, and
when the control signal is deactivated, the supplying of the clock signal is stopped.

6. The method of claim 5, wherein, in the activating of the precharge signal,
the precharge signal is activated at the time point when the delay time passes, the delay time being determined in response to delay information in synchronization with the clock signal.

7. The method of claim 5, further comprising receiving an active command, before the receiving of the read command or the write command.

8. A semiconductor device comprising:
a command decoder configured to decode an external command and generate a read command or write command;
a clock transfer unit configured to transfer an external clock signal as a source clock signal;
a precharge signal generation unit configured to generate a precharge signal in response to the read command or the write command and use the source clock signal during a period from a time point when the read command or the write command is applied to a time point when the precharge signal is activated; and
a precharge operation control unit configured to control a precharge operation of the semiconductor device in response to the precharge signal,
wherein the precharge operation control unit is configured to control a bit line sense amplifier of the semiconductor device in response to the precharge.

9. The semiconductor device of claim 8, wherein the precharge signal generation unit is configured to activate the precharge signal at a time point when a delay time passes from the time point when the read command or the write command is applied.

* * * * *